(12) United States Patent
Fujimoto et al.

(10) Patent No.: US 8,659,040 B2
(45) Date of Patent: Feb. 25, 2014

(54) SEMICONDUCTOR LIGHT-EMITTING DEVICE AND PROCESS FOR PRODUCTION THEREOF

(75) Inventors: Akira Fujimoto, Kawasaki (JP); Ryota Kitagawa, Tokyo (JP); Koji Asakawa, Kawasaki (JP); Hidefumi Yasuda, Kawasaki (JP); Yasuhiko Akaike, Kawasaki (JP); Takeyuki Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/439,895

(22) Filed: Apr. 5, 2012

(65) Prior Publication Data

US 2012/0187414 A1     Jul. 26, 2012

Related U.S. Application Data

(60) Division of application No. 12/717,537, filed on Mar. 4, 2010, now Pat. No. 8,357,557, which is a continuation of application No. PCT/JP2009/065756, filed on Sep. 9, 2009.

(30) Foreign Application Priority Data

Jan. 6, 2009    (JP) ................................ 2009-000758

(51) Int. Cl.
    *H01L 33/32*     (2010.01)

(52) U.S. Cl.
    USPC ............................... 257/95; 257/98; 257/103

(58) Field of Classification Search
    None
    See application file for complete search history.

(56) References Cited

U.S. PATENT DOCUMENTS

| | | |
|---|---|---|
| 5,779,924 A | 7/1998 | Krames et al. |
| 6,565,763 B1 | 5/2003 | Asakawa et al. |
| 7,037,738 B2 | 5/2006 | Sugiyama et al. |
| 7,999,249 B2 * | 8/2011 | Moteki et al. .................. 257/12 |

(Continued)

FOREIGN PATENT DOCUMENTS

| | | |
|---|---|---|
| CN | 1433088 A | 7/2003 |
| DE | 197 09 228 A1 | 9/1997 |

(Continued)

OTHER PUBLICATIONS

Park et al., "Large Area Dense Nanoscale Patterning of Arbitrary Surface", applied Physics Letters, vol. 79, No. 2, pp. 257-259, (2001).

(Continued)

*Primary Examiner* — Zandra Smith
*Assistant Examiner* — Pamela E Perkins
(74) *Attorney, Agent, or Firm* — Finnegan, Henderson, Farabow, Garrett & Dunner, L.L.P.

(57) ABSTRACT

One aspect of the present invention provides a semiconductor light-emitting device improved in luminance, and also provides a process for production thereof. The process comprises a procedure of forming a relief structure on the light-extraction surface of the device by use of a self-assembled film. In that procedure, the light-extraction surface is partly covered with a protective film so as to protect an area for an electrode to be formed therein. The electrode is then finally formed there after the procedure. The process thus reduces the area incapable, due to thickness of the electrode, of being provided with the relief structure. Between the electrode and the light-extraction surface, a contact layer is formed so as to establish ohmic contact between them.

11 Claims, 4 Drawing Sheets

(56) References Cited

U.S. PATENT DOCUMENTS

| | | |
|---|---|---|
| 2003/0222048 A1 | 12/2003 | Asakawa et al. |
| 2004/0050816 A1 | 3/2004 | Asakawa et al. |
| 2005/0145864 A1* | 7/2005 | Sugiyama et al. .............. 257/95 |
| 2005/0277218 A1 | 12/2005 | Nakajo et al. |
| 2006/0231525 A1 | 10/2006 | Asakawa et al. |
| 2006/0267034 A1* | 11/2006 | Orita ............................. 257/95 |
| 2009/0130380 A1 | 5/2009 | Asakawa et al. |
| 2010/0117109 A1 | 5/2010 | Unno |
| 2011/0291133 A1* | 12/2011 | Tanaka et al. .................. 257/98 |
| 2012/0241808 A1* | 9/2012 | Akiyama et al. ............... 257/99 |

FOREIGN PATENT DOCUMENTS

| | | | |
|---|---|---|---|
| EP | 1 329 961 A2 | 7/2003 | |
| GB | 2 311 413 A | 9/1997 | |
| JP | 10-004209 | 1/1998 | |
| JP | 2001-151834 | 6/2001 | |
| JP | 2003-218383 | 7/2003 | |
| JP | 2003-258296 | 9/2003 | |
| JP | 2006-108635 | 4/2006 | |
| JP | 2006-222288 | 8/2006 | |
| JP | 2006-253172 * | 9/2006 | .............. H01L 33/00 |
| JP | 2007-220865 | 8/2007 | |
| JP | 2007-220902 | 8/2007 | |
| TW | 575984 | 2/2004 | |

OTHER PUBLICATIONS

International Search Report issued by the Japanese Patent Office on Oct. 13, 2009, for International Patent Application No. PCT/JP2009/065756.

English Abstract of SG 54385, published Nov. 16, 1998.

Search Report of GB 9705173.4 dated May 28, 1997.

Notification of Reasons for Rejection issued by the Japanese Patent Office on Nov. 22, 2011, for Japanese Patent Application No. 2009-000758, and English-language translation thereof.

* cited by examiner

SEMICONDUCTOR LIGHT-EMITTING DEVICE AND PROCESS FOR PRODUCTION THEREOF

CROSS REFERENCE TO RELATED APPLICATIONS

This is a division of application Ser. No. 12/717,537, filed Mar. 4, 2010 now U.S. Pat. No. 8,357,557, which is a continuation of prior International Application No. PCT/JP2009/065756, filed Sep. 9, 2009; the entire contents of all of which are incorporated herein by reference.

BACKGROUND OF THE INVENTION

1. Field of the Invention

The present invention relates to a process for production of a semiconductor light-emitting device in which an improved relief structure is formed on the light-extraction surface, and also relates to the semiconductor light-emitting device produced thereby.

2. Description of Related Art

For the purpose of improving the light-extraction efficiency of a semiconductor light-emitting device such as a light-emitting diode (LED), it has hitherto been proposed to form a relief structure on the light-extraction surface of the device by use of a self-assembled block copolymer film as a mask (see, Patent documents 1, 2).

The relief structure is generally formed after an electrode is provided on the light-extraction surface. Specifically, first a self-assembled film is formed by spin-coating on the light-extraction surface previously provided with an electrode thereon, and then the light-extraction surface is dry-etched through the pattern of self-assembling as a mask to form a relief structure. However, since the electrode normally has a thickness of 1 μm or more, the self-assembled film formed thereover by spin-coating has a large step around the electrode and hence the film in the area covering around the electrode is locally thicker than the designed thickness. Because of this locally large thickness, the self-assembling pattern in the area around the electrode cannot be transferred onto the light-extraction surface, and consequently the relief structure is formed in a smaller area. In particular, considering that the area around the electrode generally gives off intense luminescence, it is a critical problem that the relief structure cannot be formed there. There is thus room for improvement in luminance of the device.

JP-A 2007-220865 (KOKAI) describes a method in which a relief structure is previously formed by photolithography on the light-extraction surface and thereafter an electrode is provided thereon. This method enables to form the relief structure in the area near the electrode. However, if the light-extraction surface contains semiconductors of high etching rates such as GaAs, the method cannot form a good relief structure.

SUMMARY OF THE INVENTION

It is an object of the present invention to provide a process for production of a semiconductor light-emitting device in which a relief structure can be formed in an area closer to the electrode on the light-extraction surface.

One aspect of the present invention resides in a process for production of a semiconductor light-emitting device having a semiconductor layer the surface of which a relief structure and an electrode are formed on and light is extracted from; comprising:

stacking an active layer and said semiconductor layer on a substrate, providing said semiconductor layer with such a contact layer as brings said electrode and the surface of said semiconductor layer into ohmic contact with each other, forming an oxide film on the surface of said semiconductor layer in an area where said electrode is to be formed, forming a protective film on said semiconductor layer in the whole surface area including the area where said oxide film is formed, forming a self-assembled film on said protective film, fabricating said protective film by dry etching through said self-assembled film as a mask, to form a protective film mask, fabricating said semiconductor layer by dry etching through said protective film mask, to form said relief structure, and removing said protective film in the area where said electrode is to be formed, followed by depositing there an electroconductive material on said contact layer to form said electrode.

Another aspect of the present invention resides in a process for production of a semiconductor light-emitting device having a semiconductor layer the surface of which a relief structure and an electrode are formed on and light is extracted from; comprising:

stacking an active layer and said semiconductor layer on a substrate, forming an oxide film on the surface of said semiconductor layer in an area where said electrode is to be formed, forming a protective film on said semiconductor layer in the whole surface area including the area where said oxide film is formed, forming a self-assembled film on said protective film, fabricating said protective film by dry etching through said self-assembled film as a mask, to form a protective film mask, fabricating said semiconductor layer by dry etching through said protective film mask, to form said relief structure, removing said protective film in the area where said electrode is to be formed, followed by depositing an electroconductive material there on said contact layer to form said electrode, and establishing ohmic contact between said electrode and the surface of said semiconductor layer.

Still another aspect of the present invention resides in a semiconductor light-emitting device produced by either of the above processes.

Yet another aspect of the present invention resides in a semiconductor light-emitting device having a semiconductor layer the surface of which a relief structure and an electrode are formed on and light is extracted from, wherein said relief structure is formed in the area of 10 μm or less from the electrode.

DETAILED DESCRIPTION OF THE INVENTION

Embodiments of the present invention are described below in detail.

Figure 1:
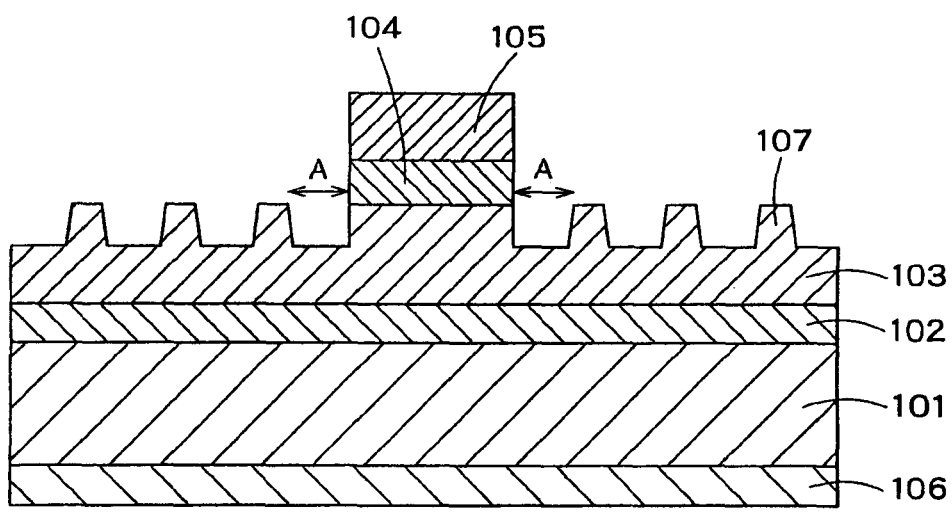
FIG. 1 is a sectional view schematically illustrating the structure of a LED produced according to one embodiment of the present invention.

FIG. 1 is a sectional view schematically illustrating the structure of a LED produced according to one embodiment of the present invention.

The light-emitting device shown in the drawing comprises a substrate 101 of, for example, n-type GaAs. On the substrate 101, a hetero structure 102 including, for example, an n-type InAlP clad layer, an InGaP active layer and a p-type InAlP clad layer is formed and further a current spreading layer 103 of, for example, p-type InGaAlP is formed thereon. On a part of the current spreading layer 103, a p-side electrode 105 is provided. Further, a thin GaAs contact layer 104 is provided between the electrode 105 and the current spreading layer 103 so as to bring them into ohmic contact with each other. Particularly in the case where the current spreading layer 103 comprises a multi-element material, for example, a three- or more element material such as InGaAlP or AlGaAs, it is difficult without the contact layer to bring the current spreading layer into ohmic contact with the electrode formed thereon. If it results in failure to establish the ohmic contact, current loss occurs to impair the luminance. The contact layer is therefore necessary. The material of the contact layer is normally GaAs, GaP or the like although depending on the semiconductor layer and the electrode, between which the contact layer is placed. On the bottom surface of the substrate, an n-side electrode 106 is provided. Luminescence emitted from the active layer is extracted from the surface of the current spreading layer 103 in the area where the electrode 105 is not formed.

In addition, according to one aspect of the present invention, submicro-projections 107 constituting a relief structure are formed on the bare surface of the current spreading layer in the area where the electrode is not formed. The relief structure contributes for improving luminance of the LED. Since a LED generally emits luminescence strongly from an area around the electrode, the relief structure is preferably formed in an area closer to the electrode. However, according to the conventional process, the relief structure cannot be formed near the electrode. Specifically, in the conventional process, the electrode and the submicro-projection of the relief structure are generally so formed that the interval (A) between them in FIG. 1 is 10 μm or more. This is because the electrode is formed before a block copolymer is spin-coated to form a self-assembled film thereof in the conventional process. The film thus formed over the electrode is locally too thick in the area around the electrode, and hence has a step there.

In contrast, the present invention makes it possible to form the electrode and the submicro-projection of the relief structure so closer that the interval between them can be made 10 μm or less. Accordingly, the present invention enables to produce a light-emitting device having a relief structure formed in a larger area. As described above, the present invention can remarkably shorten the interval between the electrode and the submicro-projection of the relief structure. Even so, however, if the interval is less than 1 μm, current density worse spreads in the current spreading layer and consequently light is given off from a smaller area of the active layer, to impair the internal luminance efficiency. That is, therefore, not preferred.

[Process for Production of a Light-emitting Device]

The following describes a process according to one embodiment of the present invention for production of a semiconductor light-emitting device. The present inventors have already developed a technique utilizing a submicro-phase separation structure of block copolymer (see, for example, JP-A 2003-258296 (KOKAI)). That technique can be adopted in the process of the present invention. The process employing the above technique is explained below in detail by referring to FIG. 2.

First, a hetero structure 102 comprising an n-type InAlP clad layer, an InGaP active layer and a p-type InAlP clad layer is formed on an n-GaAs substrate 101, and then a current spreading layer 103 of p-type InGaAlP is formed thereon by epitaxial growth. On the current spreading layer, a p-type GaAs contact layer 104 (0.1 μm) is formed for the purpose of establishing ohmic contact. On the bottom surface of the substrate, an n-side electrode 106 is formed (FIG. 2 (a)).

Subsequently, a $SiO_2$ film 201 is formed on the whole surface by chemical vapor deposition (hereinafter, referred to as "CVD") (FIG. 2 (b)). After that, a resist film (not shown) is formed on the $SiO_2$ film 201 and then subjected to exposure and development to obtain a resist pattern for forming an electrode. By use of the obtained resist pattern, the $SiO_2$ film is fabricated by wet etching. Successively, the GaAs contact layer is also fabricated by wet etching. Finally, the residual resist film is removed (FIG. 2 (c)). The GaAs contact layer is normally removed in the whole area other than where the electrode is to be formed.

Thereafter, a protective film, such as a $SiO_2$ film 202, is provided for the purpose of forming a relief structure on the substrate. The protective film preferably has a thickness of 300 nm or less. If the protective film has that thickness, a self-assembled film subsequently formed thereon can have a reduced local thickness in the area around the electrode. As a result, the protective film having the above thickness can increase the area where the relief structure is formed. The formed $SiO_2$ film is then spin-coated with a solution of sub-micro-phase separation composition containing block copolymer dissolved in a solvent, to form a block copolymer film 203, which is successively prebaked to remove the solvent. The block polymer, for example, comprises a polystyrene segment and a polymethyl methacrylate segment. The block copolymer film is annealed under nitrogen gas atmosphere, whereby the block polymer causes phase separation (FIG. 2 (d)) to form two or more polymer fragments (203A, 203B).

Subsequently, the phase-separated block copolymer film shown in FIG. 2 (d) is etched by reactive ion etching (hereinafter, referred to as "RIE"). Since the two or more polymer fragments have different etching rates, some of them are selectively etched to leave a fine polymer pattern 204 shown in FIG. 2 (e).

After that, the $SiO_2$ film is fabricated by RIE through the polymer pattern 204 as a mask. The gases usable in the RIE are, for example, fluorine-containing gases such as $CF_4$, $CHF_3$ and $C_4F_8$, and they may be doped with Ar or $O_2$. After the fabrication by RIE, the polymer mask 204 is unnecessary and hence generally removed by oxygen ashing or the like. In this way, a pattern 205 of the protective film ($SiO_2$) is formed (FIG. 2 (f)).

Thereafter, the InGaAlP current spreading layer is fabricated by RIE with a proper etching gas through the $SiO_2$ pattern 205 as a mask, to form submicro-projections 107 and consequently to obtain a fine relief pattern. The gas used in the RIE fabrication is not restricted to $Cl_2$, and the etching can be performed with $BCl_3$ or $N_3$. Further, the gas may be doped with Ar. After the etching procedure, the SiO$_2$ film 201 and the SiO$_2$ pattern 205 are removed to form a relief pattern comprising, for example, columnar submicro-projections 107 on the surface of the device (FIG. 2 (g)).

Subsequently, the relief pattern is sputtered in an inert gas such as Ar gas or He gas, and thereby the top and bottom of each submicro-projection 107 are sputtered to obtain a relief structure comprising submicro-projections in the shapes of cones, columns or mesas shown in FIG. 2 (h).

Finally, the SiO$_2$ film covering the area for an electrode to be formed therein is removed by wet etching. After that, a lift-off resist film is formed there and then subjected to exposure and development to provide an electrode-forming pattern. Successively, an electrode 206 is formed by, for example, vapor deposition of gold. The resist pattern is then removed to form an electrode (FIG. 2 (i)). The process according to the present invention can thus give a semiconductor light-emitting device.

The above describes an example in which a SiO$_2$ film is used as the protective film for the electrode. However, the protective film is by no means restricted to a SiO$_2$ film, and other films such as SiN, SiON and TiO$_2$ films are also usable.

The present invention is further explained below in detail by use of the following examples, in which LEDs having relief structures produced according to the present invention were compared in luminance with conventional LEDs having relief structures formed after formation of the electrodes.

In the process according to the present invention, an area for the electrode to be formed therein is protected in an early stage and then later the electrode is formed there, so that a relief structure can be formed in an area closer to the electrode. Consequently, the process of the present invention reduces the area where the relief structure is not formed, and makes it possible to form the relief structure in an area around the electrode, namely, in an area giving off intense luminescence. The present invention can thus improve the luminance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

Example 1

According to the aforementioned process, a LED was produced.

Figure 2:
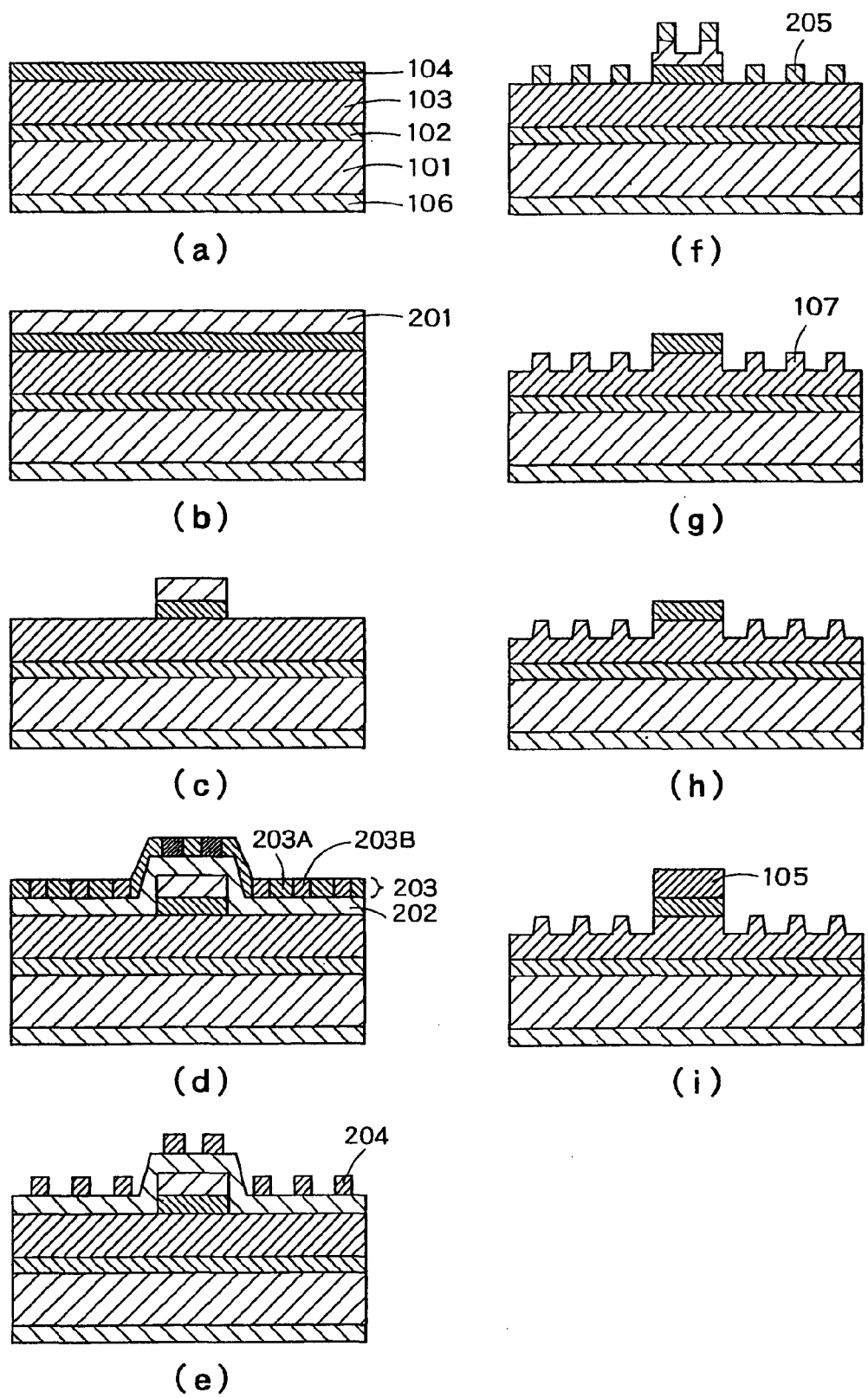
FIG. 2 shows sectional views schematically illustrating a process for production of a semiconductor light-emitting device according to one embodiment of the present invention.

As illustrated in FIG. 2 (a), on an n-GaAs substrate 101, a hetero structure 102 comprising an n-type InAlP clad layer, an InGaP active layer and a p-type InAlP clad layer was formed. Further, a current spreading layer 103 containing four elements of p-type InGaAlP was formed thereon by epitaxial growth. On the current spreading layer 103, a p-type GaAs contact layer 104 (0.1 μm) was formed for the purpose of establishing ohmic contact. On the bottom surface of the substrate, an n-side electrode 106 was formed to produce a LED element. The element gave off luminescence at 635 nm.

Subsequently, a 300-nm thick SiO$_2$ film 201 was formed on the whole surface by CVD (FIG. 2 (b)). After that, a 1-μm thick film of i-ray resist (THMR [trademark], manufactured by TOKYO OHKA KOGYO CO., LTD.) was formed on the SiO$_2$ film and then subjected to exposure and development to obtain a resist pattern for forming an electrode. By use of the obtained resist pattern, the SiO$_2$ film was wet-etched with ammonium fluoride. Successively, the GaAs contact layer 104 was also wet-etched with phosphoric acid. Finally, the residual resist was removed with a remover (FIG. 2 (c)).

Thereafter, a 100-nm thick SiO$_2$ protective film 202 was formed by CVD for the purpose of forming a relief structure on the substrate. The formed SiO$_2$ film was then spin-coated at 3000 rpm with a solution containing block copolymer dissolved in a solvent, and successively the applied solution was prebaked at 110° C. for 90 seconds to remove the solvent, whereby a 150-nm thick block copolymer film 203 was formed. The block polymer comprised a polystyrene (hereinafter, referred to as "PS") block (molecular weight: 315000) and a polymethyl methacrylate (hereinafter, referred to as "PMMA") block (molecular weight: 785000). The block copolymer film was then annealed at 210° C. for 4 hours under nitrogen gas atmosphere to separate the phases of PA and PMMA, whereby a pattern of approx. 110 nm diameter PS dots was formed (FIG. 2 (d)).

Subsequently, the phase-separated block copolymer film was etched by RIE under the conditions of O$_2$ flow: 30 sccm, pressure: 13.3 Pa (100 mTorr), power: 100 W. Since the PS and PMMA had different etching rates, the PMMA was selectively etched to leave a PS pattern 204 shown in FIG. 2 (e).

After that, the SiO$_2$ film 202 was etched through the PS pattern as a mask under the conditions of CF$_4$ flow: 30 sccm, pressure: 1.33 Pa (10 mTorr), power: 100 W. After the etching procedure, the remaining PS pattern 204 was unnecessary and hence removed by O$_2$ ashing. In this way, a SiO$_2$ mask pattern was formed as shown in FIG. 2 (f).

Thereafter, inductive coupled plasma (hereinafter referred to as "ICP") etching was carried out for 2 minutes under the conditions of Ar/Cl$_2$=5/20 sccm, 0.266 Pa (2 mTorr), incident power/bias power=100/300 W, to form columnar submicro-projections 107 shown in FIG. 2 (g).

Subsequently, the submicro-projections were sputtered for 60 seconds in Ar gas under the conditions of Ar flow: 50 sccm, pressure: 0.65 Ps (5 mTorr), power: 300 W. Those conditions were so moderate that the columnar submicro-projections 107 were removed not completely but partly and hence that only the tops and bottoms thereof were sputtered to form submicro-projections in the shapes of cones or mesas.

Thereafter, the SiO$_2$ film 201 covering the area for an electrode to be formed therein was removed by wet etching. After that, a lift-off resist (TLOR [trademark], manufactured by TOKYO OHKA KOGYO CO., LTD.) was coated thereon to form a 3-μm thick resist film and then subjected to exposure and development to form an electrode-forming pattern. Successively, gold/gold-zinc were vapor-deposited to form a 1-μm thick film. The resist was then removed with a remover to form a gold electrode 206 (FIG. 2 (i)). Finally, annealing treatment was carried out at 400° C. for 30 minutes under nitrogen gas atmosphere so as to bring the electrode 206 and the GaAs contact layer 104 into ohmic contact with each other. The above procedures thus gave a semiconductor light-emitting device (LED) according to the present invention.

Comparative Example 1

Subsequently, a comparative LED comprising a relief structure was produced according to the conventional process. Specifically, the procedures of Example 1 were repeated except that a substrate beforehand provided with a gold electrode was prepared and a relief structure was formed thereon.

In the conventionally produced LED of Comparative Example 1, the relief structure was formed in the area of at least 12 μm from the electrode. On the other hand, in the LED of Example 1, the relief structure was formed in the area of at least 1 to 5 μm from the electrode. As a result of that, the LED of Example 1 was improved by 20% in luminance as compared with the LED of Comparative Example 1.

Example 2

Figure 3:
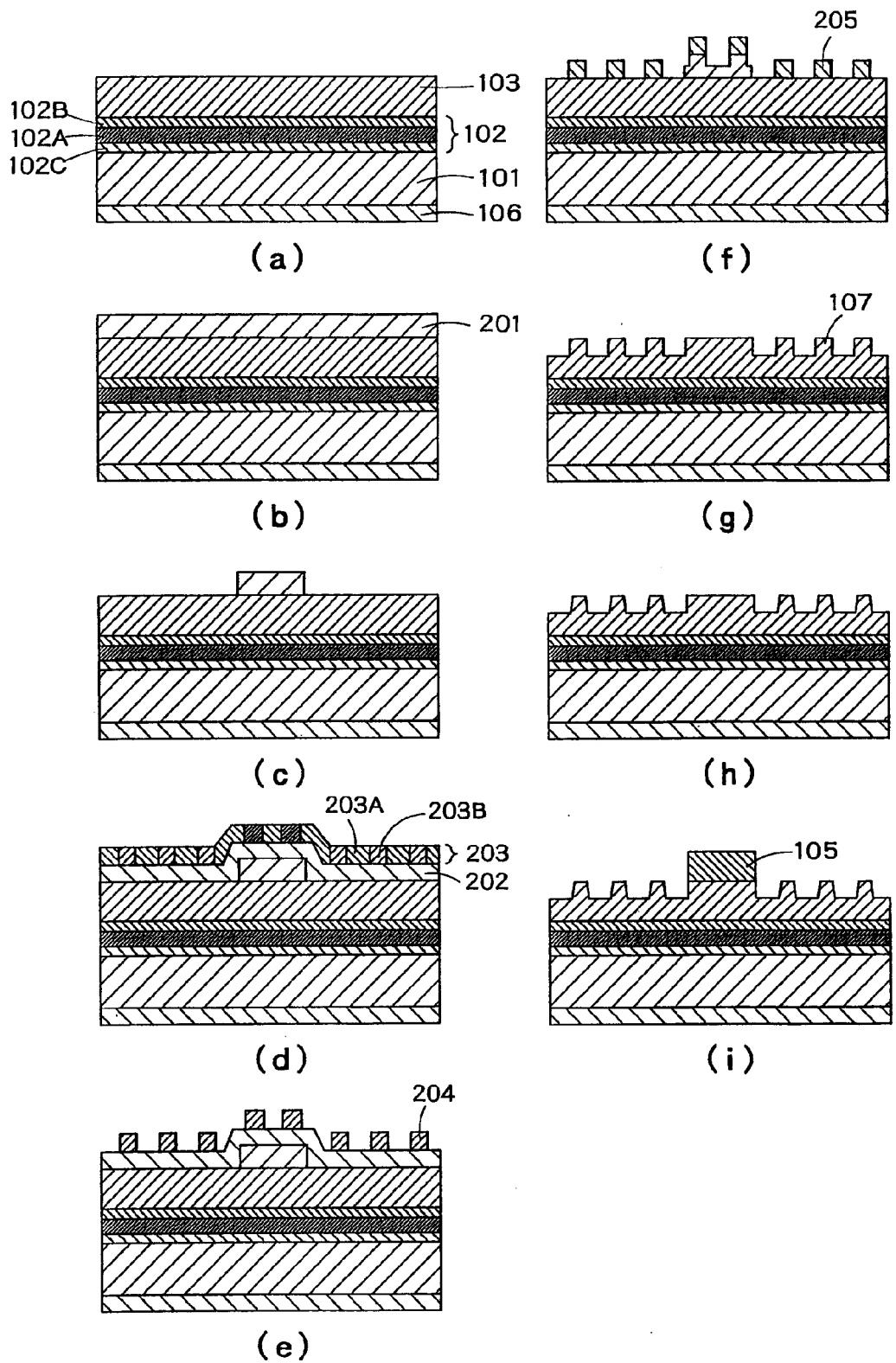
FIG. 3 shows sectional views schematically illustrating a process for production of the semiconductor light-emitting device in Example 2.

As illustrated in FIG. 3 (a), on an n-GaP substrate 101, a double hetero structure 102 comprising an n-InAlP clad layer 102B, a p-InAlP clad layer 102C, and an InGaAlP active layer 102A placed between them was formed. Further, a p-GaP current spreading layer 103 was formed thereon. This p-GaP current spreading layer served as a contact layer as well as a semiconductor layer from which light was extracted. On the whole bottom surface of the n-GaP substrate, an n-side electrode 106 was formed to produce a LED element. The element gave off luminescence at 612 nm.

Subsequently, a 200-nm thick $SiO_2$ film 201 was formed on the whole surface by CVD in the same manner as in Example 1 (FIG. 3 (b)). After that, a 1-μm thick film of i-ray resist (THMR [trademark], manufactured by TOKYO OHKA KOGYO CO., LTD.) was coated on the $SiO_2$ film and then subjected to exposure and development to obtain a resist pattern for forming an electrode. By use of the obtained resist pattern, the $SiO_2$ film was wet-etched with ammonium fluoride. Finally, the residual resist was removed with a remover (FIG. 3 (c)).

Thereafter, a 70-nm thick $SiO_2$ protective film 202 was formed by CVD in the same manner as in Example 1 for the purpose of forming a relief structure on the substrate. Successively, a block copolymer film 203 was provided and then a phase-separation pattern was formed in the block copolymer film in the same manner as in Example 1 (FIG. 3 (d)).

Subsequently, the phase-separated block copolymer film was etched by RIE under the conditions of $O_2$ flow: 30 sccm, pressure: 13.3 Pa (100 mTorr), power: 100 W, whereby the phase separated PS and PMMA were etched to leave a PS pattern 204 shown in FIG. 3 (e).

After that, the $SiO_2$ film 202 was etched through the PS pattern 204 as a mask under the conditions of $CF_4$ flow: 30 sccm, pressure: 1.33 Pa (10 mTorr), power: 100 W in the same manner as in Example 1. After the etching procedure, the remaining PS pattern 204 was unnecessary and hence removed by $O_2$ ashing. In this way, a $SiO_2$ mask pattern 205 was formed as shown in FIG. 3 (f).

Thereafter, ICP etching was carried out for 2 minutes under the conditions of $BCl_3/Cl_2$=5/20 sccm, 0.266 Pa (2 mTorr), incident power/bias power=100/100 W, to form columnar submicro-projections 107 shown in FIG. 3 (g).

Subsequently, the submicro-projections were sputtered for 60 seconds in Ar gas under the conditions of Ar flow: 50 sccm, pressure: 0.65 Ps (5 mTorr), power: 300 W in the same manner as in Example 1, whereby the tops and bottoms of the submicro-projections were sputtered to form cone-shaped or mesa-shaped submicro-projections.

Thereafter, the $SiO_2$ film covering the area for an electrode to be formed therein was removed by wet etching. After that, a lift-off resist (TLOR [trademark], manufactured by TOKYO OHKA KOGYO CO., LTD.) was coated thereon to form a 3-μm thick resist film and then subjected to exposure and development to form an electrode-forming pattern. Successively, gold/gold-zinc were vapor-deposited to form a 1-μm thick film. The resist was then removed with a remover to form a gold electrode 105 (FIG. 3 (i)). Finally, annealing treatment was carried out at 400° C. for 30 minutes under nitrogen gas atmosphere so as to bring the electrode 105 and the GaP current spreading layer 103 (also serving as a contact layer) into ohmic contact with each other. The above procedures thus gave a semiconductor light-emitting device (LED) according to the present invention.

Comparative Example 2

Subsequently, a comparative LED comprising a relief structure was produced according to the conventional process. Specifically, the procedures of Example 2 were repeated except that a substrate beforehand provided with a gold electrode was prepared and a relief structure was formed thereon.

In the conventionally produced LED of Comparative Example 2, the relief structure was formed in the area of at least 10 μm from the electrode. On the other hand, in the LED of Example 2, the relief structure was formed in the area of at least 1 to 3 μm from the electrode. As a result of that, the LED of Example 2 was improved by 25% in luminance as compared with the LED of Comparative Example 2.

Example 3

Figure 4:
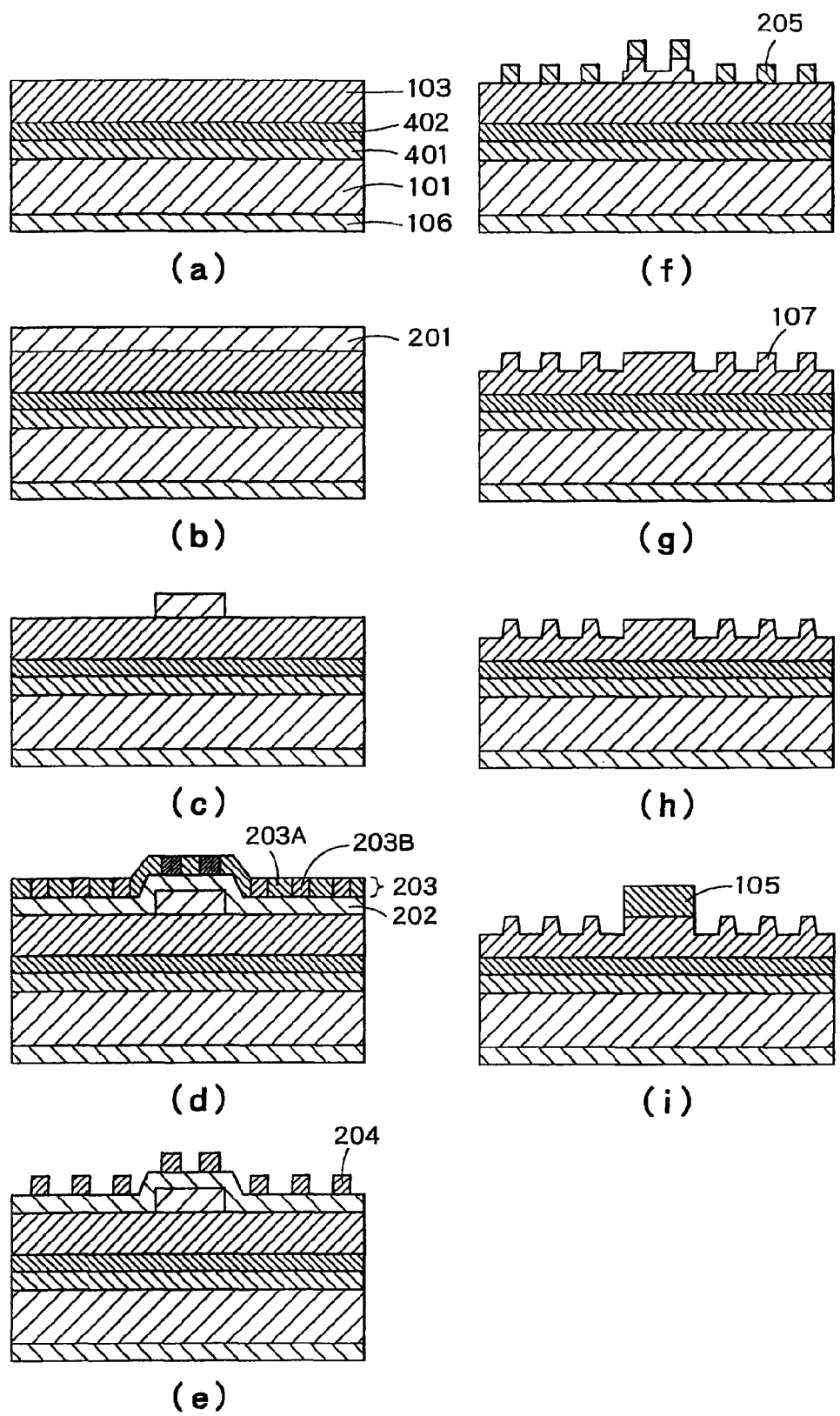
FIG. 4 shows sectional views schematically illustrating a process for production of the semiconductor light-emitting device in Example 3.

As illustrated in FIG. 4 (a), on an n-type GaN substrate 101, an InGaN/GaN MQW active layer 401 comprising an n-type GaN buffer layer and an n-type GaN clad layer, a p-type AlGaN cap layer 402, and a p-type GaN contact layer 103 were formed by epitaxial growth. On the bottom surface of the substrate, an n-side electrode 106 was formed to produce a light-emitting element. The n-side electrode was made of Ti. The produced light-emitting diode (LED) gave off luminescence at 400 nm.

Subsequently, a 300-nm thick $SiO_2$ film 201 was formed on the whole surface by CVD in the same manner as in Example 1 (FIG. 4 (b)). After that, a 1-μm thick film of i-ray resist (THMR [trademark], manufactured by TOKYO OHKA KOGYO CO., LTD.) was coated on the $SiO_2$ film 201 and then subjected to exposure and development to obtain a resist pattern for forming an electrode. By use of the obtained resist pattern, the $SiO_2$ film 201 was wet-etched with ammonium fluoride. Finally, the residual resist was removed with a remover (FIG. 4 (c)).

Thereafter, a 130-nm thick $SiO_2$ protective film 202 was formed by CVD in the same manner as in Example 1 for the purpose of forming a relief structure on the substrate. Successively, a block copolymer film 203 was provided and then a phase separation pattern was formed in the block copolymer film in the same manner as in Example 1 (FIG. 4 (d)).

Subsequently, the phase-separated block copolymer film was etched by RIE under the conditions of $O_2$ flow: 30 sccm, pressure: 13.3 Pa (100 mTorr), power: 100 W, and thereby the phase separated PS and PMMA were etched to leave a PS pattern 204 shown in FIG. 4 (e).

After that, the $SiO_2$ film 202 was etched through the PS pattern 204 as a mask under the conditions of $CF_4$ flow: 30 sccm, pressure: 1.33 Pa (10 mTorr), power: 100 W in the same manner as in Example 1. After the etching procedure, the remaining PS pattern 204 was unnecessary and hence removed by $O_2$ ashing. In this way, a $SiO_2$ mask pattern 205 was formed as shown in FIG. 4 (f).

Thereafter, ICP etching was carried out for 150 seconds under the conditions of $BCl_3/Cl_2$=5/20 sccm, 0.266 Pa (2 mTorr), incident power/bias power=100/300 W, to form columnar submicro-projections 107 shown in FIG. 4 (g).

Subsequently, the submicro-projections were sputtered for 60 seconds in Ar gas under the conditions of Ar flow: 50 sccm, pressure: 0.65 Ps (5 mTorr), power: 300 W in the same manner as in Example 1, whereby the tops and bottoms of the submicro-projections were sputtered to form cone-shaped or mesa-shaped submicro-projections.

Thereafter, the $SiO_2$ film covering the area for an electrode to be formed therein was removed by wet etching. After that, a lift-off resist (TLOR [trademark], manufactured by TOKYO OHKA KOGYO CO., LTD.) was coated thereon to form a 3-μm thick resist film and then subjected to exposure and development to form an electrode-forming pattern. Successively, nickel and gold were vapor-deposited to form a 1-μm thick film. The resist was then removed with a remover to form a nickel-gold electrode (FIG. 4 (*i*)). The above procedures thus gave a semiconductor light-emitting device (LED) according to the present invention.

Comparative Example 3

Subsequently, a comparative LED comprising a relief structure was produced according to the conventional process. Specifically, the procedures of Example 3 were repeated except that a substrate beforehand provided with a nickel-gold electrode was prepared and a relief structure was formed thereon.

In the conventionally produced LED of Comparative Example 3, the relief structure was formed in the area of at least 15 μm from the electrode. On the other hand, in the LED of Example 3, the relief structure was formed in the area of at least 2 to 8 μm from the electrode. As a result of that, the LED of Example 3 was improved by 20% in luminance as compared with the LED of Comparative Example 3.

The invention claimed is:

1. A semiconductor light-emitting device comprising:
  a semiconductor layer;
  a current spreading layer formed on said semiconductor layer;
  a relief structure formed on a surface of said current spreading layer where light is extracted, wherein the relief structure and the current spreading layer are formed of the same semiconductor material; and
  an electrode formed on said current spreading layer where no relief structure is formed,
  wherein said relief structure is formed in the area of 10 μm or less from the electrode.

2. The device according to claim 1, wherein said relief structure is formed in the area of 5 μm or less from the electrode.

3. The device according to claim 1, wherein said relief structure is formed in the area of 3 μm or less from the electrode.

4. The device according to claim 1, wherein said relief structure is not formed in the area of 1 μm or less from the electrode.

5. The device according to claim 1, wherein the surface of said current spreading layer contains at least three elements.

6. The device according to claim 1, wherein the surface of said current spreading layer contains at least one material selected from the group consisting of InGaAlP, AlGaAs and AlGaN.

7. The device according to claim 1, wherein said electrode is gold, gold-zinc alloy, gold-germanium alloy or gold-nickel alloy.

8. The device according to claim 1, further comprising a contact layer between said current spreading layer and said electrode.

9. The device according to claim 8, wherein said contact layer contains GaAs, GaN or GaP.

10. The device according to claim 1, wherein said relief structure comprises projections in the shapes of cones, columns or mesas.

11. The device according to claim 10, wherein said projections are submicro-projections.

* * * * *